(12) United States Patent
Ogino et al.

(10) Patent No.: US 11,502,162 B2
(45) Date of Patent: Nov. 15, 2022

(54) SEMICONDUCTOR APPARATUS AND DEVICE WITH SEMICONDUCTOR LAYER HAVING CRYSTAL ORIENTATIONS THAT DIFFER IN YOUNG'S MODULUS AND RELATIVE ANGLE

(71) Applicant: CANON KABUSHIKI KAISHA, Tokyo (JP)

(72) Inventors: Takumi Ogino, Tokyo (JP); Katsunori Hirota, Kanagawa (JP); Hiroaki Kobayashi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 50 days.

(21) Appl. No.: 17/110,916

(22) Filed: Dec. 3, 2020

(65) Prior Publication Data
US 2021/0175324 A1 Jun. 10, 2021

(30) Foreign Application Priority Data
Dec. 6, 2019 (JP) .............................. JP2019-221442

(51) Int. Cl.
*H01L 29/04* (2006.01)
*H01L 23/00* (2006.01)
(Continued)

(52) U.S. Cl.
CPC ............ *H01L 29/045* (2013.01); *H01L 24/08* (2013.01); *H01L 25/0657* (2013.01);
(Continued)

(58) Field of Classification Search
CPC ............... H01L 29/045; H01L 25/0657; H01L 2224/08145; H01L 24/08;
(Continued)

(56) References Cited

U.S. PATENT DOCUMENTS 4,542,397 A * 9/1985 Biegelsen ............... H01L 24/95
438/455
2012/0248544 A1* 10/2012 Yokoyama .......... H01L 25/0657
438/455
(Continued)

FOREIGN PATENT DOCUMENTS

JP 2019-140237 A 8/2019

OTHER PUBLICATIONS

Hopcroft et al. "What is the Young's Modulus of Silicon?" Journal of Microelectromechanical Systems, vol. 19, No. 2, Apr. 2010 pp. 229-2338 is a study of the elastic moduli of silicon crystal orientations. (Year: 2010).*

*Primary Examiner* — Sonya McCall-Shepard
(74) *Attorney, Agent, or Firm* — Canon U.S.A., Inc., IP Division

(57) ABSTRACT

A semiconductor apparatus includes a first semiconductor layer, a second semiconductor layer overlapping the first semiconductor layer, and a wiring structure arranged between them. The second semiconductor layer is provided with p-type MIS transistor. A crystal structure of the first semiconductor layer has a first crystal orientation and a second crystal orientation in direction along a principal surface of the first semiconductor layer. A Young's modulus of the first semiconductor layer in a direction along the first crystal orientation is higher than that in a direction along the second crystal orientation. An angle formed by the first crystal orientation and a direction in which a source and a drain of the p-type MIS transistor are arranged is more than 30 degrees and less than 60 degrees, and an angle formed by the second crystal orientation and that direction is 0 degrees or more and 30 degrees or less.

21 Claims, 6 Drawing Sheets

(51) Int. Cl.
*H01L 25/065* (2006.01)
*H01L 27/088* (2006.01)
*H01L 29/205* (2006.01)
*H01L 25/18* (2006.01)
*H01L 27/146* (2006.01)
*H01L 27/092* (2006.01)

(52) U.S. Cl.
CPC .......... *H01L 27/088* (2013.01); *H01L 29/205* (2013.01); *H01L 2224/08145* (2013.01)

(58) Field of Classification Search
CPC . H01L 2224/08121; H01L 2224/48227; H01L 2224/73201; H01L 2224/80357; H01L 27/14634; H01L 27/14636; H01L 21/187; H01L 2224/80894–80896; H01L 2224/81894–81896; H01L 2224/82895–82897; H01L 2224/83894–83896; H01L 21/02428–0243; H01L 21/02433; H01L 29/04–045

See application file for complete search history.

(56) References Cited

U.S. PATENT DOCUMENTS

2012/0292664 A1\* 11/2012 Kanike ................. H01L 29/458
 257/E21.24
2018/0366445 A1\* 12/2018 Dote ................... H01L 21/8221

\* cited by examiner

SEMICONDUCTOR APPARATUS AND DEVICE WITH SEMICONDUCTOR LAYER HAVING CRYSTAL ORIENTATIONS THAT DIFFER IN YOUNG'S MODULUS AND RELATIVE ANGLE

BACKGROUND OF THE INVENTION

Field of the Invention

The present disclosure relates to a semiconductor apparatus.

Description of the Related Art

There is a semiconductor apparatus that includes a plurality of stacked semiconductor layers each having a different function. Japanese Patent Laid-Open No. 2019-140237 discusses a photoelectric conversion apparatus that includes first and second semiconductor layers. A plurality of photoelectric conversion units is two-dimensionally arranged on the first semiconductor layer. A second semiconductor layer includes a signal processing circuit that processes signals output from the plurality of photoelectric conversion units.

According to Japanese Patent Laid-Open No. 2019-140237, a semiconductor layer includes a p-channel metal oxide semiconductor (PMOS) transistor. The present inventor studied the technique discussed in Japanese Patent Laid-Open No. 2019-140237 and found that there were cases where the PMOS transistor did not have excellent characteristics and that there was a margin for improvement in performance of the semiconductor apparatus.

SUMMARY OF THE INVENTION

The disclosure is directed to a semiconductor apparatus that shows excellent performance.

A first aspect of the disclosure provides a semiconductor apparatus comprising: a first semiconductor layer; a second semiconductor layer overlapping the first semiconductor layer; and a wiring structure arranged between the first semiconductor layer and the second semiconductor layer, wherein the second semiconductor layer is provided with a p-type metal insulator semiconductor (p-type MIS) transistor, wherein a crystal structure of the first semiconductor layer has a first crystal orientation and a second crystal orientation in a direction along a principal surface of the first semiconductor layer, and a Young's modulus of the first semiconductor layer in a direction along the first crystal orientation is higher than a Young's modulus of the first semiconductor layer in a direction along the second crystal orientation, wherein an angle formed by the first crystal orientation and a direction in which a source and a drain of the p-type MIS transistor are arranged is more than 30 degrees and less than 60 degrees, and wherein an angle formed by the second crystal orientation and the direction in which the source and the drain of the p-type MIS transistor are arranged is 0 degrees or more and 30 degrees or less.

A second aspect of the disclosure provides a device comprising: the above semiconductor apparatus; and at least one of: an optical apparatus corresponding to the semiconductor apparatus; a control apparatus that controls the semiconductor apparatus; a processing apparatus that processes a signal output from the semiconductor apparatus; a display apparatus that displays information acquired from the semiconductor apparatus; a storage apparatus that stores the information acquired from the semiconductor apparatus; and a mechanical apparatus that operates based on the information acquired from the semiconductor apparatus.

Further features of the disclosure will become apparent from the following description of exemplary embodiments with reference to the attached drawings.

DESCRIPTION OF THE EMBODIMENTS

Figure 1A:
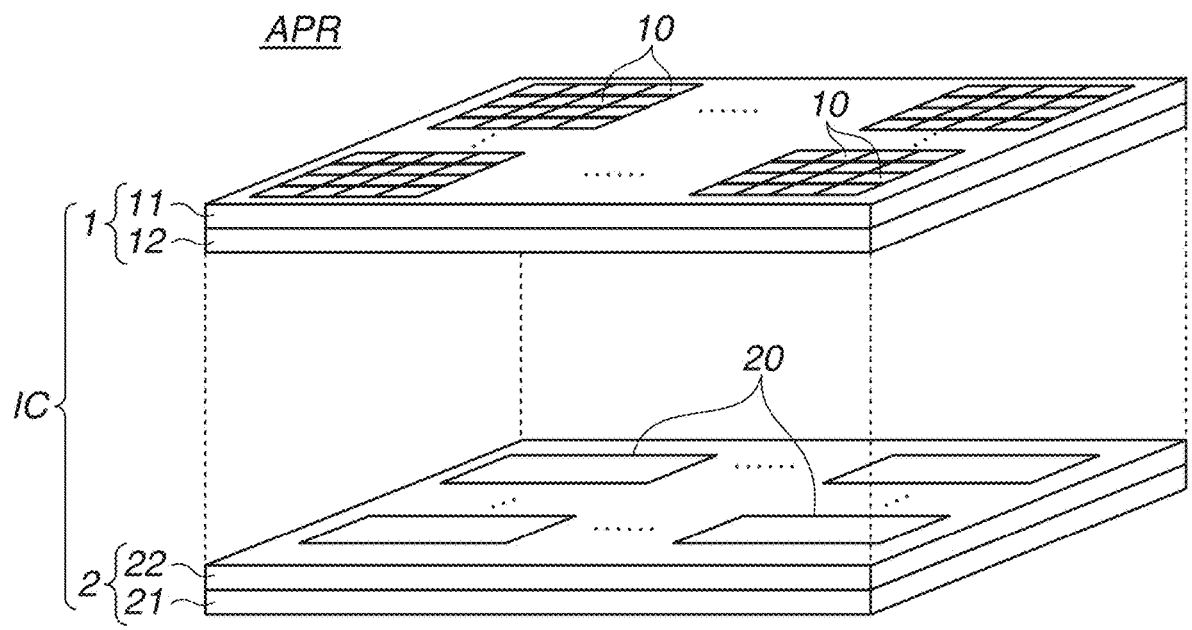
FIGS. 1A and 1B are schematic views illustrating a semiconductor apparatus.

Various exemplary embodiments of the disclosure will be described below with reference to the drawings. In the descriptions below and the drawings, similar configurations are given the same reference numeral on a plurality of drawings. Thus, the configurations will be described with reference to the plurality of drawings, and redundant descriptions of the configurations with the same reference numeral are omitted.

First Exemplary Embodiment

FIG. 1A illustrates a semiconductor apparatus APR. The semiconductor apparatus APR is entirely or partially a semiconductor device integrated circuit (semiconductor device IC) including chips 1 and 2 being stacked. The semiconductor apparatus APR according to the present exemplary embodiment is, for example, a photoelectric conversion apparatus that can be used as an image sensor, an autofocus (AF) sensor, a photometric sensor, or a distance measurement sensor. The semiconductor apparatus APR includes the stacked chips 1 and 2. The chip 1 includes a plurality of electric circuits 10 arranged in a matrix form. The chip 2 includes a plurality of electric circuits 20.

The chip 1 includes a semiconductor layer 11 and a wiring structure 12. The semiconductor layer 11 includes a plurality of semiconductor elements (not illustrated) of the plurality of electric circuits 10. The wiring structure 12 includes M wiring layers (not illustrated) of the plurality of electric circuits 10. The chip 2 includes a semiconductor layer 21 and a wiring structure 22. The semiconductor layer 21 includes a plurality of semiconductor elements (not illustrated) of the plurality of electric circuits 20. The wiring structure 22 includes N wiring layers (not illustrated) of the plurality of electric circuits 20.

The semiconductor layer 21 overlaps the semiconductor layer 11. The wiring structures 12 and 22 are arranged between the semiconductor layers 11 and 21.

The wiring structure 12 is arranged between the semiconductor layers 11 and 21. The wiring structure 22 is arranged between the wiring structure 12 and the semiconductor layer 21.

The electric circuits 10 can be a pixel circuit that includes a photoelectric conversion element and typically further includes an amplification element. Details thereof will be described below. The electric circuits 20 are electric circuits that drive the electric circuits 10 and process signals from the electric circuits 10.

The semiconductor apparatus APR to which the present exemplary embodiment is applicable is not limited to photoelectric conversion apparatuses. The present exemplary embodiment is also applicable to, for example, the semiconductor apparatus APR that includes the chips 1 and 2 and one of the chips 1 and 2 includes a calculation circuit while the other includes a storage circuit. Further, one of the chips 1 and 2 of the semiconductor apparatus APR can include a control circuit that controls the other one of the chips 1 and 2. Further, one of the chips 1 and 2 of the semiconductor apparatus APR can include a processing circuit that processes signals output from the other one of the chips 1 and 2.

Figure 1B:
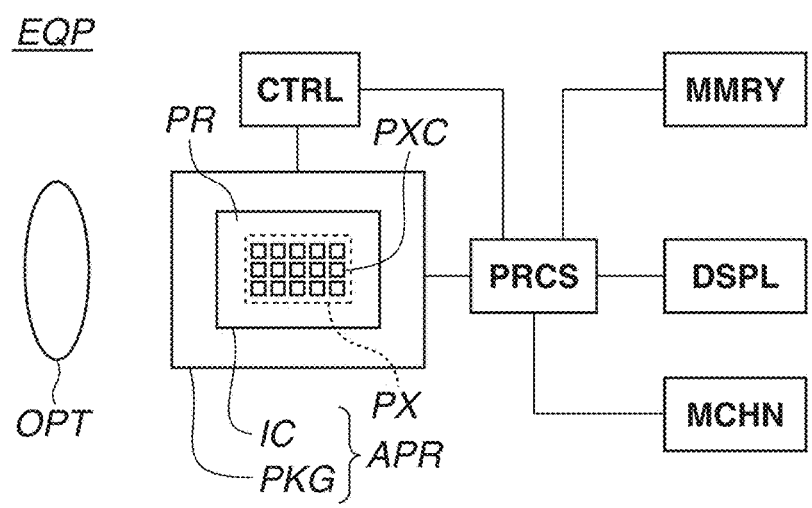

FIG. 1B illustrates a device EQP that includes the semiconductor apparatus APR. The semiconductor device IC includes a pixel area PX where pixels PXC including the electric circuits 10 are arranged in a matrix form. The pixels PXC can include a microlens and/or a color filter in addition to the photoelectric conversion elements of the electric circuits 10. The semiconductor device IC can include a peripheral area PR around the pixel area PX. Circuits other than the electric circuits 10 can be arranged in the peripheral area PR. The semiconductor apparatus APR can include a package PKG for storing the semiconductor device IC in addition to the semiconductor device IC. The device EQP can further include at least one of an optical apparatus OPT, a control apparatus CTRL, a processing apparatus PRCS, a display apparatus DSPL, a storage apparatus MMRY, and a mechanical apparatus MCHN. Details of the device EQP will be described below.

Figure 2:
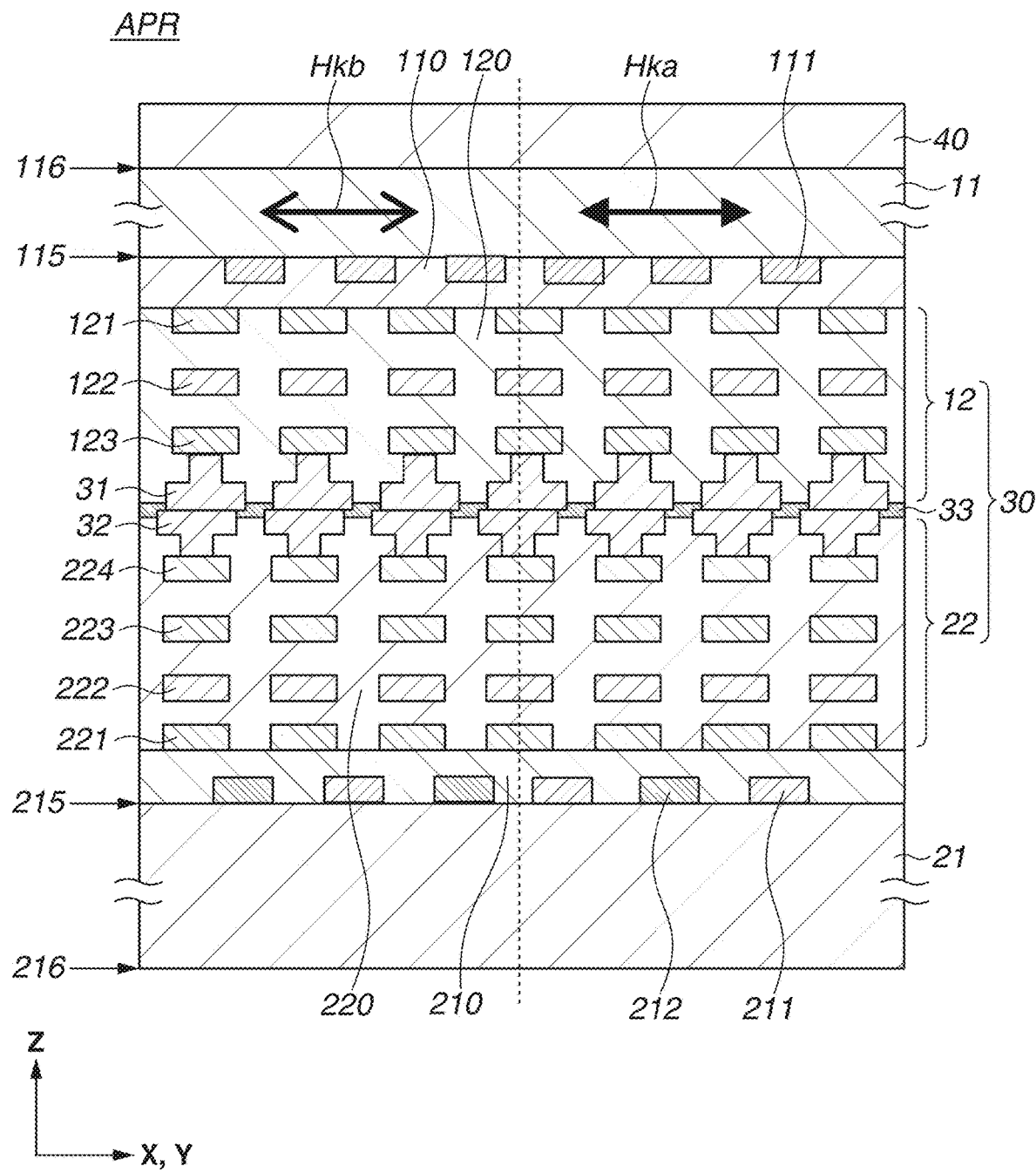
FIG. 2 is a schematic view illustrating a semiconductor apparatus.

FIG. 2 is a cross-sectional view illustrating the semiconductor apparatus APR. The semiconductor layer 11 includes a front surface 115, a back surface 116, and a side surface. The front surface 115 and the back surface 116 are two principal surfaces of the semiconductor layer 11 and are opposite surfaces. The semiconductor layer 21 includes a front surface 215, a back surface 216, and a side surface. The front surface 215 and the back surface 216 are two principal surfaces of the semiconductor layer 21 and are opposite surfaces. The thickness of the semiconductor layer 11 is the distance between the front surface 115 and the back surface 116. The thickness of the semiconductor layer 21 is the distance between the front surface 215 and the back surface 216. The thickness of the semiconductor layer 11 is less than the thickness of the semiconductor layer 21. The thickness of the semiconductor layer 11 is, for example, 1 μm to 10 μm, e.g., 2 μm to 5 μm. The thickness of the semiconductor layer 21 is, for example, 10 μm to 1000 μm, e.g., 50 μm to 500 μm or 700 μm to 800 μm. In a case where the semiconductor layer 21 is fabricated using a 200- to 300-mm wafer, if the wafer is processed to become extremely thin, the semiconductor layers 11 and/or 21 may be damaged. Thus, the thickness of the semiconductor layer 21 is desirably 700 μm or more and 800 μm or less. Gate electrodes 111 of n-type metal insulator semiconductor (n-type MIS) transistors are provided on the front surface 115. While p-type metal insulator semiconductor (p-type MIS) transistors are not provided on the semiconductor layer 11 in the present exemplary embodiment, gate electrodes of p-type MIS transistors can be provided on the front surface 115. Gate electrodes 212 of p-type MIS transistors are provided on the front surface 215. While the gate electrodes 211 of n-type MIS transistors are provided on the front surface 215 in the present exemplary embodiment, the semiconductor layer 21 does not have to include n-type MIS transistors. The present exemplary embodiment focuses especially on the p-type MIS transistors. Since gate electrodes of MIS transistors are typically oxides, the MIS transistors can also be referred to as MOS transistors. A circuit that uses an n-type MOS transistor and a p-type MOS transistor is commonly referred to as a complementary metal oxide semiconductor (CMOS) circuit, but gate insulation films of MIS transistors of CMOS circuits are not limited to oxides and can be nitrides or carbides.

An insulation film 110 covering the gate electrodes 111 is provided between the semiconductor layer 11 and the wiring structure 12. An insulation film 210 covering the gate electrodes 211 and 212 is provided between the semiconductor layer 21 and the wiring structure 22.

The wiring structure 12 includes multi-level wiring layers 121, 122, and 123, electrode pads 31 on the wiring layers 123, and an insulator member 120 around the wiring layers 121, 122, and 123 and the electrode pads 31. The electrode pads 31 are in depressions (trenches) of the insulator member 120. Specifically, the electrode pads 31 have a damascene structure. While the electrode pads 31 have a dual damascene structure in the present exemplary embodiment, the electrode pads 31 can have a single damascene structure. A main component of the wiring layers 121, 122, and 123 and the electrode pads 31 is copper. Here, "main component" means 80% or more by weight.

The wiring structure 22 includes multi-level wiring layers 221, 222, 223, and 224, electrode pads 32 on the wiring layers 224, and an insulator member 220 around the wiring layers 221, 222, 223, and 224 and the electrode pads 32. The electrode pads 32 are in depressions (trenches) of the insulator member 220. Specifically, the electrode pads 32 have a damascene structure. While the electrode pads 32 have a dual damascene structure in the present exemplary embodiment, the electrode pads 32 can have a single damascene structure. A main component of the wiring layers 221, 222, and 223 and the electrode pads 32 is copper. A main component of the wiring layers 224 is aluminum.

In a wiring structure 30, the wiring structures 12 and 22 are joined together at a joint surface 33. At the joint surface 33, the insulator members 120 and 220 of the wiring structures 12 and 22 are covalently bonded. Further, at the joint surface 33, the electrode pads 31 and 32 (metal pads) of the wiring structures 12 and 22 are metal-bonded. The joining by the combination of the bonding (covalent bonding) of insulators and the bonding (metal bonding) of conductors at the joint surface 33 as described above will be referred to as "hybrid joining". A form of joining the wiring structures 12 and 22 is not limited to the hybrid joining. The joint surface 33 can include only the insulator members 120 and 220, and the wiring structures 12 and 22 can be joined together by the bonding (covalent bonding) of the insulator members 120 and 220. Alternatively, the wiring structures 12 and 22 can be joined together with an adhesive agent. Alternatively, the wiring structures 12 and 22 can be joined together using bumps between the electrode pads 31 and 32 without directly joining the insulator members 120 and 220 of the wiring structures 12 and 22. In the case where the bumps are used, an underfill resin material can be provided between the insulator members 120 and 220 of the wiring structures 12 and 22. In the hybrid joining and the joining using the bumps, the chips 1 and 2 are electrically connected by the electrode pads 31 and 32. In the case where the joint surface 33 includes only the insulator members 120 and 220, wiring layers of the wiring structures 12 and 22 are connected via a through electrode (through-silicon via (TSV)) through the semiconductor layer 11 or 21.

An optical structure 40 is provided on the back surface 116 of the semiconductor layer 11 as needed. The optical structure 40 can include a microlens array, a color filter array, an in-layer lens array, a light shielding member such as a light shielding wall or light shielding film, and a dielectric film. The color filter array can be arranged between the microlens array and the semiconductor layer 11. The in-layer lens array can be arranged between the color filter array and the semiconductor layer 11. The light shielding wall of the optical structure 40 can be arranged between in-layer lenses of the in-layer lens array. The light shielding film of the optical structure 40 can be provided to shield a light-receiving region from light. The dielectric film of the optical structure 40 is a multi-layer film including an anti-reflection layer and a charge fixing layer and can include a metal oxide layer and/or a silicon compound layer.

A relationship between a crystal structure of silicon and the semiconductor layer 11 in a case where the semiconductor layer 11 is a silicon layer will be described below with reference to FIGS. 2 and 3. FIG. 2 illustrates crystal orientations HKa and HKb and crystal orientations LKa and LKb in a crystal structure of the semiconductor layer 11. The crystal orientations HKa and HKb and the crystal orientations LKa and LKb are, but not limited to, parallel to the principal surfaces (the front surface 115 and the back surface 116) of the semiconductor layer 11. In the present exemplary embodiment, the principal surfaces (the front surface 115 and the back surface 116) of the semiconductor layer 11 are parallel to a (100) plane based on plane indices of Miller indices. The semiconductor layer 11 having a single crystal structure has Young's modulus anisotropy due to the following reason. Specifically, a Young's modulus can be considered as a resistance of a crystal to a change in distance between atoms, and the distance between atoms depends on a crystal orientation. A Young's modulus of the semiconductor layer 11 is higher in directions along the crystal orientations HKa and HKb than in directions along the crystal orientations LKa and LKb. Specifically, the semiconductor layer 11 is more deformable in the directions along the crystal orientations LKa and LKb than in the directions along the crystal orientations HKa and HKb.

Figure 3:
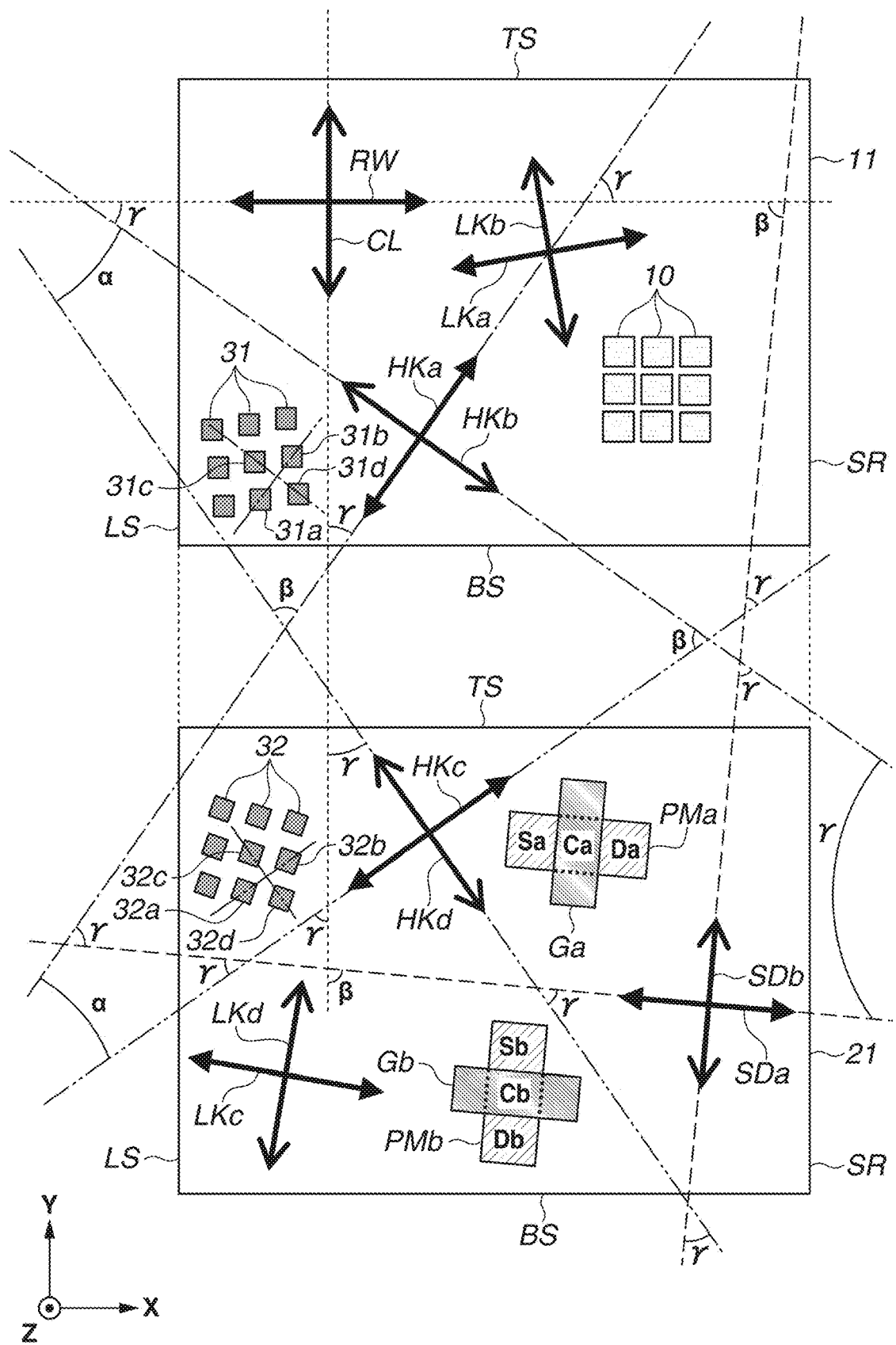
FIG. 3 is a schematic view illustrating a semiconductor apparatus.

FIG. 3 illustrates the crystal orientations HKa and HKb and the crystal orientations LKa and LKb in a case where the semiconductor layer 11 is viewed from a direction perpendicular to the front surface 115 and the back surface 116. An angle formed by the crystal orientations HKa and HKb is 60 degrees or more and 90 degrees or less. An angle formed by the crystal orientations LKa and LKb is 60 degrees or more and 90 degrees or less. An angle formed by the crystal orientations HKa and HKb and the crystal orientations LKa and LKb is more than 30 degrees and less than 60 degrees. For example, the crystal orientations HKa and HKb in the semiconductor layer 11, which is a silicon layer, are <110> orientations based on the orientation indices of the Miller indices. The semiconductor layer 11, which is a silicon layer, has at least two (e.g., six) <110> orientations, and one of the two <110> orientations is the crystal orientation HKa and the other is the crystal orientation HKb. The two <110> orientations are orthogonal. Specifically, an angle formed by the crystal orientations HKa and HKb, both of which can be <110> orientations, is 90 degrees.

The semiconductor layer 11, which is a silicon layer, has at least two (e.g., six) <100> orientations, and one of the two <100> orientations is the crystal orientation LKa and the other is the crystal orientation LKb. The two <100> orientations are orthogonal. Specifically, an angle formed by the crystal orientations LKa and LKb is 90 degrees. An angle formed by each of the two <100> orientations, which can respectively be the crystal orientations LKa and LKb, and each of the two <110> orientations, which can respectively be the crystal orientations HKa and HKb, is 45 degrees.

A Young's modulus of the semiconductor layer 11, which is a silicon layer, in a direction parallel to the <100> orientations is about 130 GPa (125 GPa to 135 GPa). A Young's modulus of the semiconductor layer 11, which is a silicon layer, in a direction parallel to the <110> orientations is about 170 GPa (165 GPa to 175 GPa). A Young's modulus in a direction between the <100> and <110> orientations is a value (130 GPa to 170 GPa) between the Young's modulus in a direction parallel to the <100> orientations and the Young's modulus in a direction parallel to the <110> orientations. Specifically, in a direction along the principal surfaces (the front surface 115 and the back surface 116) of the semiconductor layer 11, a Young's modulus of the semiconductor layer 11 can be relatively high in directions parallel to the crystal orientations HKa and HKb. Further, in directions along the principal surfaces (the front surface 115 and the back surface 116) of the semiconductor layer 11, a Young's modulus of the semiconductor layer 11 can be relatively low in directions parallel to the crystal orientations LKa and LKb. The semiconductor layer 11, which is a silicon layer, has at least two (e.g., six) <111> orientations, and a Young's modulus of the semiconductor layer 11 in directions parallel to the <111> orientations is about 185 GPa (180 GPa to 190 GPa).

Orientations (cleavage orientation) in which cleavage occurs in the semiconductor layer 11, which is a silicon layer, are <110> orientations. In a case where cleavage occurs in a cleavage orientation, cleavage planes formed by the cleavage are (110) planes based on the plane indices of the Miller indices. The cleavage planes are perpendicular to the cleavage orientation. The cleavage planes are perpendicular to (100) planes and can be perpendicular to the principal surfaces of the semiconductor layer 11. As can be understood from the above descriptions, the crystal orientations HKa and HKb are, for example, <110> orientations and therefore can be a cleavage orientation. More specifically, the cleavage planes formed by cleavage along the crystal orientation HKa, which is a cleavage orientation, are perpendicular to the crystal orientation HKb, which is a cleavage orientation. The cleavage planes formed by cleavage along the crystal orientation HKb, which is a cleavage orientation, are perpendicular to the crystal orientation HKa, which is a cleavage orientation.

FIG. 3 illustrates crystal orientations HKc and HKd and crystal orientations LKc and LKd in the case where the semiconductor layer 21 is viewed from the direction perpendicular to the front surface 215 and the back surface 216. An angle formed by the crystal orientations HKc and HKd is 60 degrees or more and 90 degrees or less. An angle formed by the crystal orientations LKc and LKd is 60 degrees or more and 90 degrees or less. An angle formed by the crystal orientation HKc or HKd and the crystal orientation LKc or LKd is more than 30 degrees and less than 60 degrees. For example, the crystal orientations HKc and HKd in the semiconductor layer 21, which is a silicon layer, are <110> orientations based on the orientation indices of the Miller indices. The semiconductor layer 21, which is a silicon layer, has at least two (e.g., six) <110> orientations, and one of the two <110> orientations is the crystal orientation HKc and the other is the crystal orientation HKd. The two <110> orientation are orthogonal. Specifically, an angle formed by the crystal orientations HKc and HKd, both of which are <110>orientations, is 90 degrees.

The semiconductor layer 21, which is a silicon layer, has at least two (e.g., six) <100> orientations, and one of the two <100> orientations is the crystal orientation LKc and the other is the crystal orientation LKd. The two <100> orientations are orthogonal. Specifically, an angle formed by the crystal orientations LKc and LKd is 90 degrees. An angle formed by each of the two <100> orientations, which can respectively be the crystal orientations HKc and HKd, and each of the two <110> orientations, which can respectively be the crystal orientations HKc and HKd, is 45 degrees.

A Young's modulus of the semiconductor layer 21, which is a silicon layer, in directions parallel to the <100> orientations is about 130 GPa (125 GPa to 135 GPa). A Young's modulus of the semiconductor layer 11, which is a silicon layer, in directions parallel to the <110> orientations is about 170 GPa (165 GPa to 175 GPa). A Young's modulus in a direction between the <100> and <110> orientations is a value (130 GPa to 170 GPa) between a Young's modulus in directions parallel to the <100> orientations and a Young's modulus in directions parallel to the <110> orientations. Specifically, in a direction along the principal surfaces (the front surface 215 and the back surface 216) of the semiconductor layer 21, a Young's modulus of the semiconductor layer 21 can be relatively high in directions parallel to the crystal orientations HKc and HKd. Further, in the direction along the principal surfaces (the front surface 215 and the back surface 216) of the semiconductor layer 21, a Young's modulus of the semiconductor layer 21 can be relatively low in directions parallel to the crystal orientations LKc and LKd. The semiconductor layer 11, which is a silicon layer, has at least two (e.g., six) <111> orientations, and a Young's modulus of the semiconductor layer 21 in directions parallel to the <111> orientations is about 185 GPa (180 GPa to 190 GPa).

Orientations (cleavage orientation) in which cleavage occurs in the semiconductor layer 21, which is a silicon layer, are <110> orientations. In a case where cleavage occurs in a cleavage orientation, cleavage planes formed by the cleavage are (110) planes based on the plane indices of the Miller indices. The cleavage planes are perpendicular to the cleavage orientation. The cleavage planes are perpendicular to (100) planes and can be perpendicular to the principal surfaces of the semiconductor layer 21. As can be understood from the above descriptions, the crystal orientations HKc and HKd are, for example, <110> orientations and therefore can be a cleavage orientation. More specifically, the cleavage planes formed by cleavage along the crystal orientation HKc, which is a cleavage orientation, are perpendicular to the crystal orientation HKd, which is a cleavage orientation. The cleavage planes formed by cleavage along the crystal orientation HKd, which is a cleavage orientation, are perpendicular to the crystal orientation HKc, which is a cleavage orientation.

An orientation in which a Young's modulus is relatively high and a crystal orientation in which a Young's modulus is relatively low are defined not just for silicon layers but for various crystal structures. Similarly, a cleavage orientation is defined not just for silicon layers but for various crystal structures. In a case where a crystal structure has a plurality of cleavage orientations along a principal surface of the crystal structure, an angle formed by the plurality of cleavage orientations can be 60 degrees or more and 90 degrees or less. In a case where a crystal structure has only two cleavage orientations along a principal surface of the crystal structure, an angle formed by the plurality of cleavage orientations can be 90 degrees. In a case where a crystal structure has only three cleavage orientations along a principal surface of the crystal structure, an angle formed by the plurality of cleavage orientations can be 60 degrees.

FIG. 3 illustrates a shape of a contour of the semiconductor layer 11 and an arrangement direction of the electric circuits 10, which are cells, in the case where the semiconductor layer 11 is viewed from the direction perpendicular to the front surface 115 and the back surface 116. The contour of the semiconductor layer 11 is substantially quadrilateral. Four sides of the contour of the semiconductor layer 11 include a right side SRa, a left side LSa, an upper side TSa, and a lower side BSa. The left side LSa is substantially parallel to the right side SRa, and the right side SRa and the left side LSa extend along a direction LR. The upper side TSa is substantially parallel to the lower side BSa, and the upper side TSa and the lower side BSa extend along a direction TB. A cell array in which the plurality of cells (electric circuits 10) is arranged in a matrix form includes cell rows and cell columns. Each cell row includes two or more cells (electric circuits 10) arranged in a row direction RW, and each cell column includes two or more cells (electric circuits 10) arranged in a column direction CL. The plurality of cell rows is arranged in the column direction CL, and the plurality of cell columns is arranged in the row direction RW.

FIG. 3 illustrates a shape of a contour of the semiconductor layer 21 in the case where the semiconductor layer 21 is viewed from the direction perpendicular to the front surface 215 and the back surface 216. The contour of the semiconductor layer 21 is substantially quadrilateral. Four sides of the contour of the semiconductor layer 21 include a right side SRb, a left side LSb, an upper side TSb, and a lower side BSb. The left side LSb is substantially parallel to the right side SRb, and the right side SRb and the left side LSb extend along the direction LR. The upper side TSb is substantially parallel to the lower side BSb, and the upper side TSb and the lower side BSb extend along the direction TB.

In the present exemplary embodiment, the contours of the semiconductor layers 11 and 21 are substantially congruent. The length of the upper side TSa is substantially equal to the length of the upper side TSb. The length of the lower side BSa is substantially equal to the length of the lower side BSb. The length of the left side LSa is substantially equal to the length of the left side LSb. The length of the right side SRa is substantially equal to the length of the right side SRb. As used herein, the phrase "substantially equal" means that the length of one of two corresponding sides is 90% or more and 110% or less of the length of the other.

The longer the length of at least one side of the semiconductor layer 11, the greater the impact of the stress of the semiconductor layer 11 on the semiconductor layer 21. Thus, the present exemplary embodiment is suitable for a case where the length of at least one side of the semiconductor layer 11 is 10 mm or more. An image capturing area of an image sensor in a format with a diagonal of about one inch is 13±1 mm×9±1 mm, so that the length of at least one side of the semiconductor layer 11 needs to be 10 mm or more. The present exemplary embodiment is more suitable for a case where the length of at least one side of the semiconductor layer 11 is 20 mm or more. An image capturing area of an image sensor in an Advanced Photo System type-C (APS-C) format is 23±1 mm×15±1 mm, so that the length of at least one side of the semiconductor layer 11 needs to be 20 mm or more. The present exemplary embodiment is even more suitable for a case where the length of at least one side of the semiconductor layer 11 is 30 mm or more. An image capturing area of an image sensor in a 35-mm format is 36±1 mm×24±1 mm, so that the length of at least one side of the semiconductor layer 11 needs to be 20 mm or more. FIG. 3 illustrates a layout of p-type MIS transistors PMa and PMb of the semiconductor layer 21 in the case where the semiconductor layer 21 is viewed from the direction perpendicular to the front surface 215 and the back surface 216.

The p-type MIS transistor PMa includes a source Sa and a drain Da. The p-type MIS transistor PMa includes a channel Ca between the source Sa and the drain Da. At least part of a gate electrode Ga of the p-type MIS transistor PMa is on the channel Ca. The source Sa and the drain Da of the p-type MIS transistor PMa are arranged in a direction SDa. The direction SDa corresponds to a channel length direction of the channel Ca, that is to say, a gate length direction of the gate electrode Ga.

The p-type MIS transistor PMb includes a source Sb and a drain Db. The p-type MIS transistor PMb includes a channel Cb between the source Sb and the drain Db. At least part of a gate electrode Gb of the p-type MIS transistor PMb is on the channel Cb. The source Sb and the drain Db of the p-type MIS transistor PMb are arranged in a direction SDb. The direction SDb corresponds to a channel length direction of the channel Cb, that is to say, a gate length direction of the gate electrode Gb.

The directions SDa and SDb intersect. Specifically, an angle formed by the directions SDa and SDb is more than 0 degrees. An angle formed by the direction SDa, in which the source Sa and the drain Da are arranged, and the direction SDb, in which the source Sb and the drain Db are arranged, can be 60 degrees or more and 90 degrees or less. An angle formed by the directions SDa and SDb is 80 degrees or more and 90 degrees or less and, in the present exemplary embodiment, the angle is 90 degrees. The semiconductor layer 21 can be provided with both or one of the p-type MIS transistors PMa and PMb.

In FIG. 3, each angle formed by directions is denoted by $\alpha$, $\beta$, or $\gamma$. The angle $\alpha$ is an angle in the range of 0 degrees or more and 30 degrees or less, desirably an angle in the range of 0 degrees or more and 10 degrees or less, typically 0 degrees. The angle $\beta$ is an angle in the range of 60 degrees or more and 90 degrees or less, desirably an angle in the range of 80 degrees or more and 90 degrees or less, typically 90 degrees. The angle y is an angle that is more than 30 and less than 60 degrees, desirably an angle in the range of 40 degrees or more and 50 degrees or less, typically 45 degrees.

In a case where an angle formed by two directions is neither 0 degrees nor 90 degrees, the angle can be an acute angle or obtuse angle, but the present specification always focuses on acute angles. Specifically, an angle formed by two directions is defined in the range of 0 degrees or more and 90 degrees or less.

An angle formed by the crystal orientation HKa of the crystal structure of the semiconductor layer 11 and the direction SDa, in which the source Sa and the drain Da of the p-type MIS transistor PMa are arranged, is more than 30 degrees and less than 60 degrees as denoted by "$\gamma$" in FIG. 3. Similarly, an angle formed by the crystal orientation HKb of the crystal structure of the semiconductor layer 11 and the direction SDa, in which the source Sa and the drain Da of the p-type MIS transistor PMa are arranged, is more than 30 degrees and less than 60 degrees as denoted by "$\gamma$" in FIG. 3. An angle formed by the crystal orientations HKa and HKb of the crystal structure of the semiconductor layer 11 and the direction SDb, in which the source Sb and the drain Db of the p-type MIS transistor PMb are arranged, is more than 30 degrees and less than 60 degrees as denoted by "$\gamma$" in FIG. 3.

An angle formed by the crystal orientation LKa of the crystal structure of the semiconductor layer 11 and the direction SDa, in which the source Sa and the drain Da of the p-type MIS transistor PMa are arranged, is 0 degrees or more and 30 degrees or less as denoted by "$\alpha$" in FIG. 3. Similarly, an angle formed by the crystal orientation LKb of the crystal structure of the semiconductor layer 11 and the direction SDa, in which the source Sa and the drain Da of the p-type MIS transistor PMa are arranged, is 0 degrees or more and 30 degrees or less as denoted by "$\alpha$" in FIG. 3. An angle formed by the crystal orientations LKa and LKb of the crystal structure of the semiconductor layer 11 and the direction SDb, in which the source Sb and the drain Db of the p-type MIS transistor PMb are arranged, is 0 degrees or more and 30 degrees or less as denoted by "$\alpha$" in FIG. 3.

The present exemplary embodiment focuses on the point that stress generated at the semiconductor layer 11 applies stress to the semiconductor layer 21. The stress generated at the semiconductor layer 11 is greater in a direction with a higher Young's modulus in the semiconductor layer 11. The stress applied to the semiconductor layer 21 and originating from the semiconductor layer 11 is greater in a direction parallel to the direction with a higher Young's modulus in the semiconductor layer 11 than in other directions. The stress generated at the semiconductor layer 21 causes a distortion in crystal structures of the channels Ca and Cb of the p-type MIS transistors PMa and PMb. The distortion in crystal structures of the channels Ca and Cb of the p-type MIS transistors PMa and PMb changes a characteristic of the p-type MIS transistors PMa and PMb. Thus, directions HKa and HKb with a high Young's modulus in the semiconductor layer 11 are arranged to be neither parallel nor perpendicular (angle $\gamma$) to the directions in which the sources Sa and Sb and the drains Da and Db are arranged in the semiconductor layer 21. Further, directions LKa and LKb with a lower Young's modulus in the semiconductor layer 11 are arranged substantially parallel (angle $\alpha$) or substantially perpendicular (angle $\beta$) to the directions in which the sources Sa and Sb and the drains Da and Db are arranged in the semiconductor layer 21. Thus, even if stress is generated at the semiconductor layer 11, the characteristics of the p-type MIS transistors PMa and PMb are less likely to be changed.

An angle formed by the crystal orientation HKa of the semiconductor layer 11 and the crystal orientation HKc of the semiconductor layer 21 is 0 degrees or more and 30 degrees or less as denoted by "$\alpha$" in FIG. 3. An angle formed by the crystal orientation HKb of the semiconductor layer 11 and the crystal orientation HKd of the semiconductor layer 21 is 0 degrees or more and 30 degrees or less as denoted by "$\alpha$" in FIG. 3. An angle formed by the crystal orientation HKa of the semiconductor layer 11 and the crystal orientation HKd of the semiconductor layer 21 is 60 degrees or more and 90 degrees or less as denoted by "$\beta$" in FIG. 3. An angle formed by the crystal orientation HKb of the semiconductor layer 11 and the crystal orientation HKc of the semiconductor layer 21 is 60 degrees or more and 90 degrees or less as denoted by "$\beta$" in FIG. 3.

As described above, the direction with a relatively high Young's modulus in the semiconductor layer 11 and the direction with a relatively high Young's modulus in the semiconductor layer 21 are substantially parallel. Further, the direction with a relatively low Young's modulus in the semiconductor layer 11 and the direction with a relatively low Young's modulus in the semiconductor layer 21 are substantially parallel. This reduces the direction dependency of stress that can be generated between the semiconductor layers 11 and 21. Thus, transistor characteristics of the semiconductor layer 11 and/or the semiconductor layer 21 are improved. Further, distortions in the semiconductor layer 11 and/or the semiconductor layer 21 during fabrication are reduced, and a yield increases. Distortions in the semiconductor layer 11 and/or the semiconductor layer 21 during fabrication are reduced, and misalignments of the electrode pads 31 and 32 in, for example, hybrid joining are reduced. This is advantageous in increasing the yield. Further, optical axis shifts of the optical structure 40, which includes the microlens array, the color filter array, and the in-layer lens array, and photodiodes on the front surface 115 of the semiconductor layer 11 are reduced, and this is advantageous in increasing the yield.

In a matrix in Table 1, angles formed by two directions are classified. For example, angles formed by the crystal orientation HKa of the crystal structure of the semiconductor layer 11 and other directions are specified in the fourth row (row HKa) from the top in Table 1, and the other directions are respectively specified in different columns For example, for the other direction that is the direction SDa, in which the source Sa and the drain Da of the p-type MIS transistor PMa are arranged, angles are specified in the second column (column SDa) from the right. A Greek letter specified in an intersection of the fourth row (row HKa) from the top and the second column (column SDa) from the right in Table 1 specifies the angle formed by the two directions. In Table 1, α denotes an angle that is 0 degrees or more and 30 degrees or less, β denotes an angle that is 60 degrees or more and 90 degrees or less, and γ denotes an angle that is more than 30 degrees and less than 60 degrees.

TABLE 1

|     | RW | CL | HKa | HKb | LKa | LKb | LR | TB | HKc | HKd | LKc | LKd | SDa | SDb |
| --- | --- | --- | --- | --- | --- | --- | --- | --- | --- | --- | --- | --- | --- | --- |
| RW  | —  | β  | γ   | γ   | α   | β   | β  | α  | γ   | γ   | α   | β   | α   | β   |
| CL  | β  | —  | γ   | γ   | β   | α   | α  | β  | γ   | γ   | β   | α   | β   | α   |
| HKa | γ  | γ  | —   | β   | γ   | γ   | γ  | γ  | α   | β   | γ   | γ   | γ   | γ   |
| HKb | γ  | γ  | β   | —   | γ   | γ   | γ  | γ  | β   | α   | γ   | γ   | γ   | γ   |
| LKa | α  | β  | γ   | γ   | —   | β   | β  | α  | γ   | γ   | α   | β   | α   | β   |
| LKb | β  | α  | γ   | γ   | β   | —   | α  | β  | γ   | γ   | β   | α   | β   | α   |
| LR  | β  | α  | γ   | γ   | β   | α   | —  | β  | γ   | γ   | β   | α   | β   | α   |
| TB  | α  | β  | γ   | γ   | α   | β   | β  | —  | γ   | γ   | α   | β   | α   | β   |
| HKc | γ  | γ  | α   | β   | γ   | γ   | γ  | γ  | —   | β   | γ   | γ   | γ   | γ   |
| HKd | γ  | γ  | β   | α   | γ   | γ   | γ  | γ  | β   | —   | γ   | γ   | γ   | γ   |
| LKc | α  | β  | γ   | γ   | α   | β   | β  | α  | γ   | γ   | —   | β   | α   | β   |
| LKd | β  | α  | γ   | γ   | β   | α   | α  | β  | γ   | γ   | β   | —   | β   | α   |
| SDa | α  | β  | γ   | γ   | α   | β   | β  | α  | γ   | γ   | α   | β   | —   | β   |
| SDb | β  | α  | γ   | γ   | β   | α   | α  | β  | γ   | γ   | β   | α   | β   | —   |

An angle formed by the crystal orientation HKa of the semiconductor layer 11 and the four sides (right side SR, left side LS, upper side TS, lower side BS) of the semiconductor layer 11 is more than 30 degrees and less than 60 degrees as denoted by "γ" in FIG. 3. An angle formed by the crystal orientation HKb of the semiconductor layer 11 and the four sides (right side SR, left side LS, upper side TS, lower side BS) of the semiconductor layer 11 is more than 30 degrees and less than 60 degrees as denoted by "γ" in FIG. 3. Specifically, an angle formed by the crystal orientation HKb of the semiconductor layer 11 and the directions TB and LR, in which the four sides of the semiconductor layer 11 extend, is more than 30 degrees and less than 60 degrees as denoted by "γ" in FIG. 3.

As described above, at least one of the crystal orientations HKa, HKb, HKc, and HKd (all of the crystal orientations HKa, HKb, HKc, and HKd in the present exemplary embodiment) is arranged to be not parallel to at least one of the four sides (all of the four sides in the present exemplary embodiment) so that the four sides of the semiconductor layers 11 and 21 are prevented from chipping and cracking. In dicing a wafer into chips, it is desirable to use a laser (laser dicing). In dicing with a blade (blade dicing), the shape of the four sides often becomes uneven due to chipping. In laser dicing, on the other hand, the shape of the four sides is less likely to be chipped, so that the unevenness is reduced. For example, the amplitude of the unevenness in the range of 100 μm along one side of the semiconductor layers 11 and 21 can be, for example, 10 μm or more in blade dicing, but in laser dicing, for example, less than 10 μm can be realized.

An angle formed by the crystal orientation LKa of the semiconductor layer 11 and the crystal orientation LKc of the semiconductor layer 21 is 0 degrees or more and 30 degrees or less as denoted by "α" in Table 1. An angle formed by the crystal orientation LKb of the semiconductor layer 11 and the crystal orientation LKd of the semiconductor layer 21 is 0 degrees or more and 30 degrees or less as denoted by "α" in Table 1. An angle formed by the crystal orientation LKa of the semiconductor layer 11 and the crystal orientation LKd of the semiconductor layer 21 is 60 degrees or more and 90 degrees or less as denoted by "β" in Table 1. An angle formed by the crystal orientation LKb of the semiconductor layer 11 and the crystal orientation LKc of the semiconductor layer 21 is 60 degrees or more and 90 degrees or less as denoted by "β" in Table 1.

The wiring structure 30 can include joint portions 31a, 31b, 31c, and 31d where the electrode pads 31 of the wiring structure 12 and the electrode pads 32 of the wiring structure 22 are joined together. The joint portions 31a and 31b are adjacent, and neither joint portions nor the electrode pads 31 and 32 are situated between the joint portions 31a and 31b. The joint portions 31c and 31d are adjacent, and neither joint portions nor the electrode pads 31 and 32 are situated between the joint portions 31c and 31d. The joint portions 31a and 31b are arranged along the crystal orientation HKa. The joint portions 31c and 31d are arranged along the cleavage orientation HKb. A line connecting the joint portions 31c and 31d passes between the joint portions 31a and 31b. The joint portions 31a, 31b, 31c, and 31d are arranged with respect to the crystal orientations HKa and HKb as described above so that the possibility of cleavage between the joint portions 31a, 31b, 31c, and 31d decreases. Thus, the strength of the semiconductor apparatus APR increases.

Similarly, the wiring structure 30 can include joint portions 32a, 32b, 32c, and 32d where the electrode pads 31 of the wiring structure 12 and the electrode pads 32 of the wiring structure 22 are joined together. The joint portions 32a and 32b are adjacent, and neither joint portions nor the electrode pads 31 and 32 are situated between the joint portions 32a and 32b. The joint portions 32c and 32d are adjacent, and neither joint portions nor the electrode pads 31 and 32 are situated between the joint portions 32c and 32d. The joint portions 32a and 32b are arranged along the crystal orientation HKc. The joint portions 32c and 32d are arranged along the crystal orientation HKd. A line connecting the joint portions 32c and 32d passes between the joint portions 32a and 32b. The joint portions 32a, 32b, 32c, and 32d are arranged with respect to the crystal orientations HKc and HKd as described above so that the possibility of cleavage between the joint portions 32a, 32b, 32c, and 32d decreases. Thus, the strength of the semiconductor apparatus APR increases.

There are mainly three methods for fabricating the semiconductor apparatus APR including the chips 1 and 2. In a first method, a wafer including the chip 1 and a wafer including the chip 2 are joined together, and the joined wafers including the chips 1 and 2 are diced. In a second method, a wafer including one of the chips 1 and 2 is diced to produce the one of the chips 1 and 2, and the one of the chips 1 and 2 is joined with a wafer including the other one of the chips 1 and 2. Thereafter, the wafer including the other one of the chips 1 and 2 is diced. In a third method, a wafer including the chip 1 is diced to produce the chip 1, and a wafer including the chip 2 is diced to produce the chip 2. Thereafter, the chips 1 and 2 are joined together. In the first method, the contours of the semiconductor layers 11 and 21 are substantially congruent. In the second and third methods, the contours of the semiconductor layers 11 and 21 can be designed to be substantially congruent, or the contours of the semiconductor layers 11 and 21 can be designed to be different with ease. For example, the contour of the semiconductor layer 11 can be designed to be smaller than the contour of the semiconductor layer 21. The second and third methods are advantageous in a case where the wafer including the chip 1 and the wafer including the chip 2 are different in size. For example, the diameter of the wafer including the chip 2 can be 200 mm to 300 mm, and the diameter of the wafer including the chip 1 can be smaller than the diameter of the wafer including the chip 2 and can be, for example, 50 mm to 200 mm. Obviously, the diameter of the wafer including the chip 1 can be 200 mm, and the diameter of the wafer including the chip 2 can be 300 mm.

Second Exemplary Embodiment

Figure 4A:
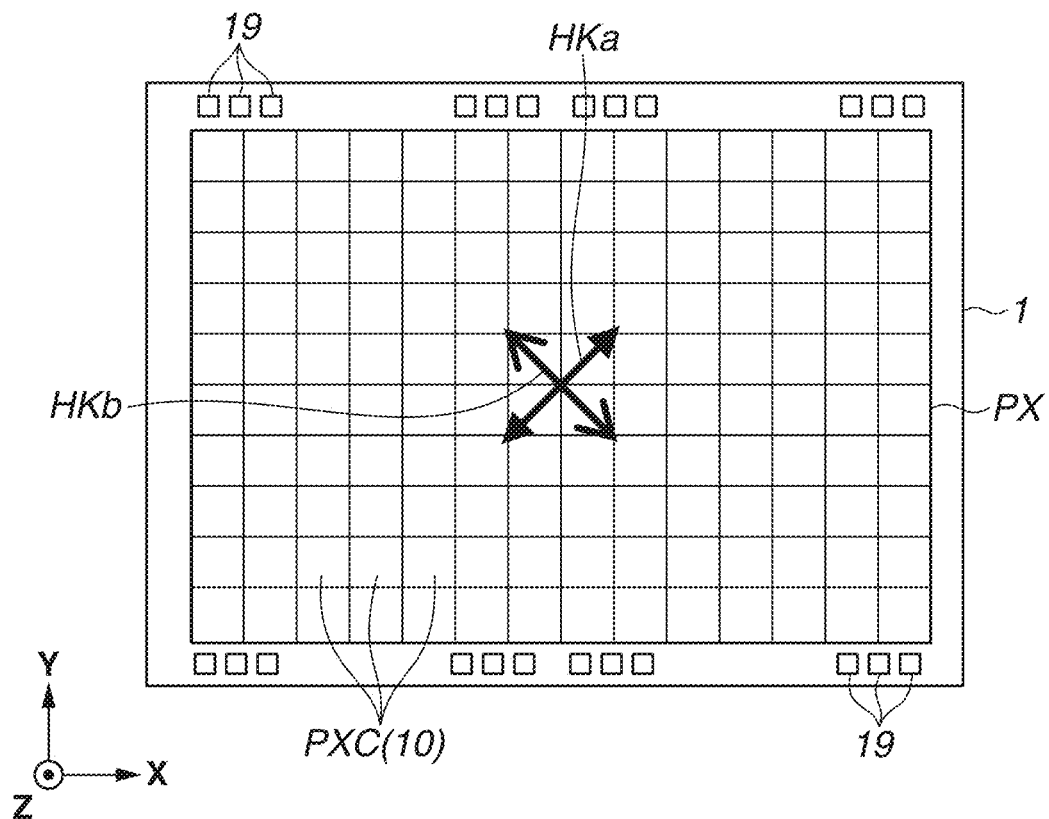
FIGS. 4A and 4B are schematic views illustrating a semiconductor apparatus.

A second exemplary embodiment applicable to the first exemplary embodiment will be described below. Redundant descriptions of points of the second exemplary embodiment that are similar to those in the first exemplary embodiment are omitted. FIG. 4A illustrates a structure of the chip 1 in more detail. The chip 1 includes a pixel region PX where pixel circuits PXC corresponding to cells (electric field circuit 10) are arranged. Pad openings 19 for connecting bonding wires to bonding pads are formed outside the pixel region PX. In FIG. 4A, the crystal orientations HKa and HKb (e.g., <110> orientations) described above in the first exemplary embodiment are illustrated. The crystal orientation LKa (e.g., <100> orientation) described above in the first exemplary embodiment is parallel to an X-direction in FIG. 4A, and the crystal orientation LKb (e.g., <100> orientation) described above in the first exemplary embodiment is parallel to a Y-direction in FIG. 4.

Figure 4B:
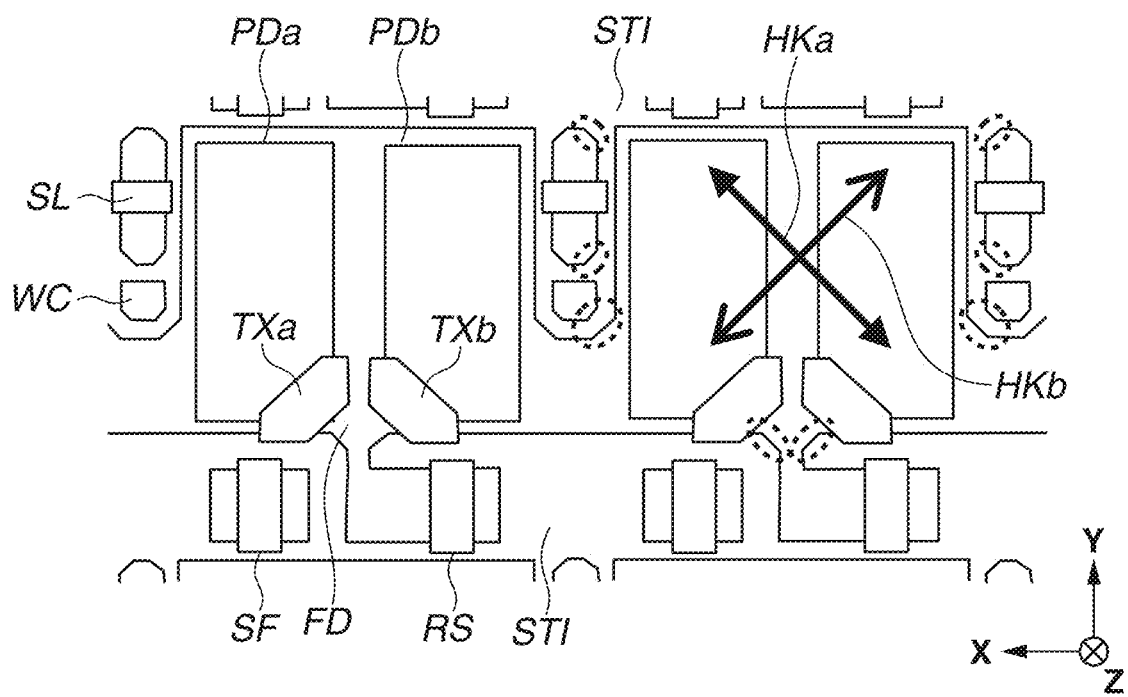

FIG. 4B illustrates a layout on the front surface 11S of the semiconductor layer 11.

In FIG. 4B, the semiconductor layer 11 in FIG. 4A is reversed to swap right and left sides. FIG. 4B illustrates two pixel circuits (electric circuits 10) each including four transistors that are a transfer transistor, an amplification transistor, a resetting transistor, and a selection transistor. A pixel sharing structure in which a plurality of pixels shares elements of pixel circuits can be employed.

The semiconductor layer 11 includes two transfer transistors that are n-type MIS transistors. The two transfer transistors respectively include gate electrodes TXa and TXb. A source of the transfer transistor that includes the gate electrode TXa is a photodiode PDa, and a drain of the transfer transistor that includes the gate electrode TXa is a floating diffusion PD. A source of the transfer transistor that includes the gate electrode TXb is a photodiode PDb, and a drain of the transfer transistor that includes the gate electrode TXb is a floating diffusion FD. Specifically, the two transfer transistors share the single floating diffusion FD. An angle formed by a direction in which the photodiode PDa and the floating diffusion FD are arranged and the crystal orientation HKa of the semiconductor layer 11 is 60 degrees or more and 90 degrees or less (90 degrees in the present exemplary embodiment). An angle formed by the direction in which the photodiode PDa and the floating diffusion FD are arranged and the crystal orientation HKb of the semiconductor layer 11 is 0 degrees or more and 30 degrees or less (0 degrees in the present exemplary embodiment). An angle formed by a direction in which the photodiode PDb and the floating diffusion FD are arranged and the crystal orientation HKa of the semiconductor layer 11 is 0 degrees or more and 30 degrees or less (0 degrees in the present exemplary embodiment). An angle formed by the direction in which the photodiode PDb and the floating diffusion FD are arranged and the crystal orientation HKb of the semiconductor layer 11 is 60 degrees or more and 90 degrees or less (90 degrees in the present exemplary embodiment).

The semiconductor layer 11 includes the amplification transistor and the resetting transistor that are n-type MIS transistors. The amplification transistor, the resetting transistor, and the amplification transistor include a gate electrode SF, and the resetting transistor includes a gate electrode RS. An angle formed by a direction in which a source and drain of the amplification transistor including the gate electrode SF are arranged and the crystal orientations HKa and HKb of the semiconductor layer 11 is more than 30 degrees and less than 60 degrees (45 degrees in the present exemplary embodiment). An angle formed by a direction in which a source and drain of the resetting transistor including the gate electrode RS are arranged and the crystal orientations HKa and HKb of the semiconductor layer 11 is more than 30 degrees and less than 60 degrees (45 degrees in the present exemplary embodiment).

The semiconductor layer 11 includes the selection transistor that is an n-type MIS transistor. The selection transistor includes a gate electrode SL. An angle formed by a direction in which a source and drain of the selection transistor including the gate electrode SL are arranged and the crystal orientations HKa and HKb of the semiconductor layer 11 is more than 30 degrees and less than 60 degrees (45 degrees in the present exemplary embodiment).

An angle formed by the direction (X-direction) in which the source and drain of the amplification transistor including the gate electrode SF are arranged and the direction (Y-direction) in which the source and drain of the selection transistor including the gate electrode SL are arranged is 60 degrees or more and 90 degrees or less (90 degrees in the present exemplary embodiment). An angle formed by the direction (X-direction) in which the source and drain of the resetting transistor including the gate electrode RS are arranged and the direction (Y-direction) in which the source and drain of the selection transistor including the gate electrode SL are arranged is 60 degrees or more and 90 degrees or less (90 degrees in the present exemplary embodiment). An angle formed by the direction in which the source and drain of the selection transistor including the gate electrode SL are arranged and the direction in which the photodiode PDb and the floating diffusion FD are arranged is more than 30 degrees and less than 60 degrees (45 degrees in the present exemplary embodiment).

The gate electrode SF of the amplification transistor and the source of the resetting transistor are connected to the floating diffusion FD. A power-supply potential is fed to the source of the resetting transistor and the drain of the amplification transistor. The source of the amplification transistor is connected to the drain of the selection transistor, and the source of the selection transistor is connected to a signal output line. The amplification transistor forms a source follower circuit.

As illustrated in FIG. 4B, arrangement directions of a source and drain of an n-type MIS transistor in the semiconductor layer 11 can include three or more directions, because the n-type MIS transistors are less likely to be affected by the crystal orientations HKa, HKb, LKa, and LKb of the semiconductor layer 11 compared to the p-type MIS transistors.

An element region of the semiconductor layer 11 is defined by an element separation portion STI including an insulator having a pattern of a periodically-repeated unit pattern. FIG. 4B illustrates a portion corresponding to two unit patterns and its neighborhood. An angle formed by 75% or more of a contour of the element separation portion STI in the unit pattern and the crystal orientations HKa and HKb of the semiconductor layer 11 is more than 30 degrees and less than 60 degrees (45 degrees in the present exemplary embodiment). In FIG. 4B, each portion surrounded by a broken line is a part of the contour of the element separation portion STI and forms an angle of 30 degrees or less or 60 degrees or more with respect to the crystal orientations HKa and HKb of the semiconductor layer 11. Minute defects are often generated in the crystal orientations HKa and HKb in the semiconductor layer 11 and become a noise source. Thus, it is desirable to minimize (less than 25%) the portion that forms an angle of 30 degrees or less or 60 degrees or more with respect to the crystal orientations HKa and HKb in the semiconductor layer 11.

Figure 5A:
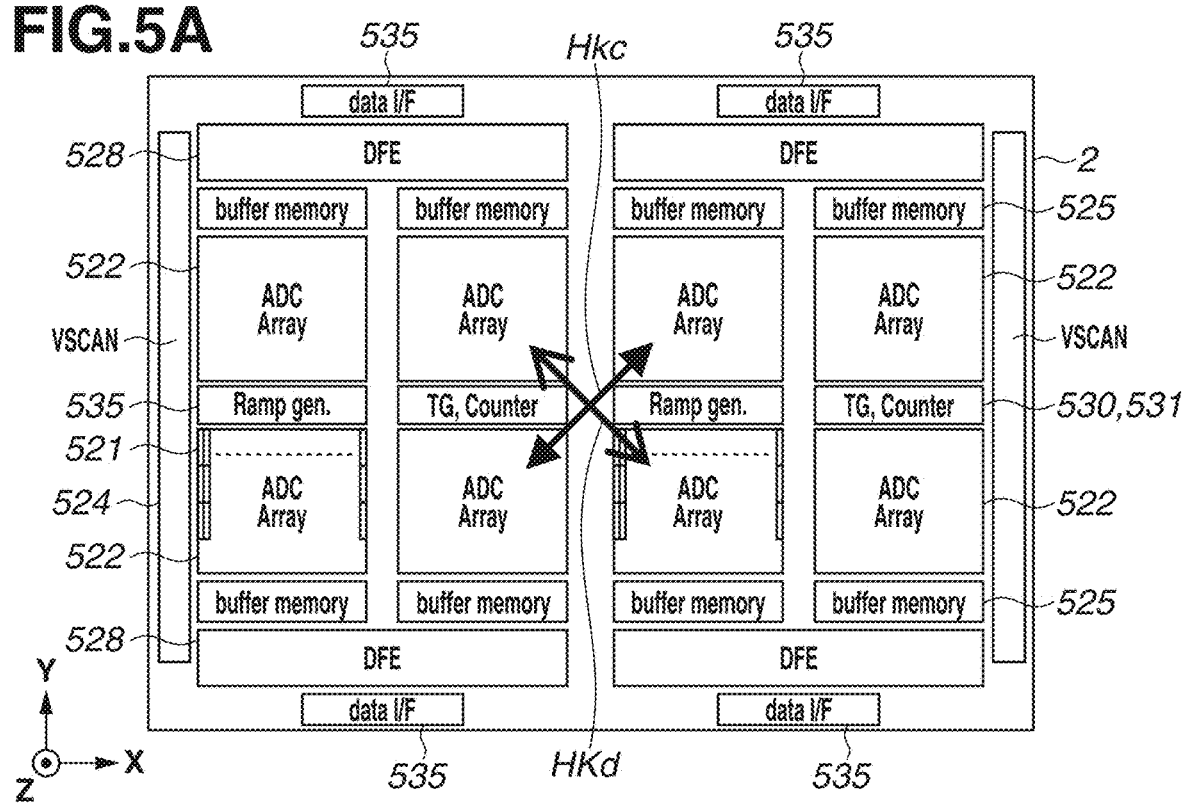
FIGS. 5A and 5B are schematic views illustrating a semiconductor apparatus.

FIG. 5A illustrates a structure of the chip 2 in more detail. Circuits are substantially symmetrically (line-symmetrically or translation-symmetrically) arranged on the left half and the right half of the chip 2. Circuits are substantially line-symmetrically arranged on the upper half and the lower half of the left half of the chip 2. Circuits are substantially line-symmetrically arranged on the upper half and the lower half of the right half of the chip 2. In FIG. 5A, the crystal orientations HKc and HKd (e.g., <110> orientations) described above in the first exemplary embodiment are illustrated. The crystal orientation LKc (e.g., <100> orientation) described above in the first exemplary embodiment is parallel to the X-direction in FIG. 5A, and the crystal orientation LKd (e.g., <100> orientation) described above in the first exemplary embodiment is parallel to the Y-direction in FIG. 5A.

The chip 2 includes a plurality of analog/digital (AD) conversion regions ("ADC Array" in FIG. 5A) 522 where analog/digital converters (ADCs) 521 are arranged in a plurality of rows and a plurality of columns Specifically, the AD conversion regions 522 are also arranged in a plurality of rows and a plurality of columns A buffer memory ("buffer memory" in FIG. 5A) 525 is provided correspondingly to each AD conversion region 522. The ADCs 521 of each AD conversion region 522 are connected to the corresponding buffer memory 525 via transmission lines (not illustrated) in FIG. 5A. Further, the chip 2 includes a vertical scan circuit 524 ("VSCAN" in FIG. 5A) that sequentially scans pixel circuits of the chip 1 row by row.

The chip 2 includes digital signal processing circuits ("DFEs" in FIG. 5A) (hereinafter, "DFEs") 528. Each DFE 528 performs various types of processing (noise reduction processing, various types of correction such as gain correction and offset correction) on digital signals output from the buffer memory 525. The chip 2 includes the plurality of DFs 528. One DFE 528 processes digital signals output from the plurality of buffer memories 525. The ADCs 521 perform ramp-signal comparison type AD conversion by comparing a ramp signal and a signal based on a signal generated by a photoelectric conversion unit. The chip 2 includes ramp signal generation units 535 ("Ramp Gen." in FIG. 5A) that generate ramp signals. The chip 2 includes timing generators ("TGs" in FIG. 5A) (hereinafter, "TGs") 530 and counters ("Counter" in FIG. 5A) 531. The TGs 530 generate various control signals. The counters 531 generate Gray code count signals for use in the ramp-signal comparison type AD conversion. The chip 2 includes data interface units ("data I/F" in FIG. 5A) (hereinafter, "IF units") 535 that output the signals processed by the DFE 528 to the outside of an image capturing apparatus.

Figure 5B:
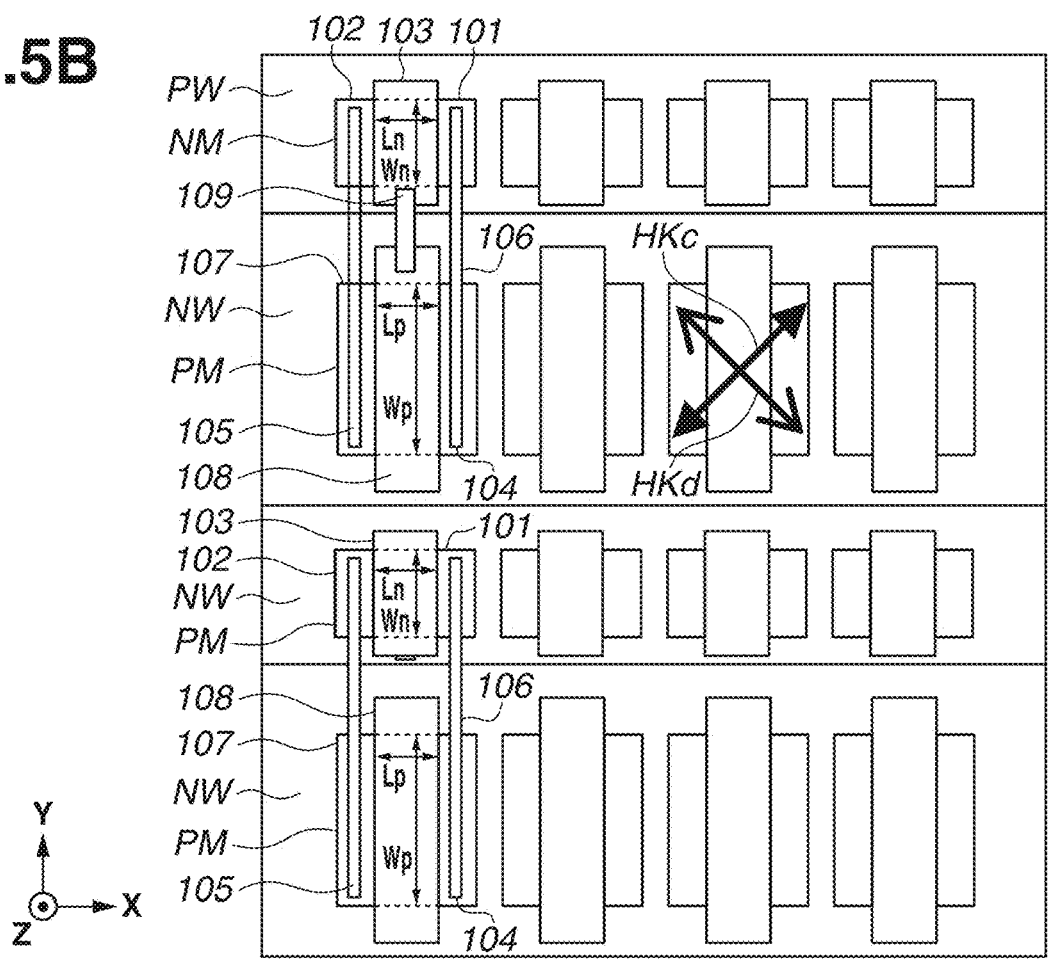

FIG. 5B illustrates an example of a layout on the front surface 215 of the semiconductor layer 21 in a part of the chip 2. The semiconductor layer 21 includes a plurality of p-type wells PW and a plurality of n-type wells NW arranged alternately. Each of the plurality of p-type wells PW includes a plurality of n-type MIS transistors NM. Each of the plurality of n-type wells NW includes a plurality of p-type MIS transistors PM. Each n-type MIS transistor NM includes an n-type source 101, a drain 102, and a gate electrode 103. Each p-type MIS transistor PM includes a p-type source 106, a drain 107, and a gate electrode 108. The sources 101 and 106 are connected via a wire 104, the drains 102 and 107 are connected via a wire 105, and the gate electrodes 103 and 108 are connected via a wire 109. This forms a CMOS switch circuit in which a node connected with the wire 109 is an input node and a node connected with the wire 104/105 is an output node. Alternatively, a circuit configuration with the sources 101 and 107 connected via a wire, the drains 102 and 106 connected via a wire, and the gate electrodes 103 and 108 connected via the wire 109 can be employed.

In FIG. 5B, a channel width of the n-type MIS transistor NM is denoted by Wn, and a channel length of the n-type MIS transistor NM is denoted by Ln. Further, in FIG. 5B, a channel width of the p-type MIS transistor PM is denoted by Wp, and a channel length of the p-type MIS transistor PM is denoted by Lp. As illustrated in FIG. 5B, an angle formed by a direction (X-direction) of the channel lengths Ln and Lp and the crystal orientations HKc and HKd is more than 30 degrees and less than 60 degrees (45 degrees in the present exemplary embodiment). Similarly, an angle formed by a direction (Y-direction) of the channel widths Wn and Wp and the crystal orientations HKc and HKd of the semiconductor layer 21 is more than 30 degrees and less than 60 degrees (45 degrees in the present exemplary embodiment). As described above, an angle formed by the direction (X-direction) of the channel lengths Ln and Lp and the crystal orientations HKa and HKb of the semiconductor layer 11 is more than 30 degrees and less than 60 degrees (45 degrees the present exemplary embodiment). Further, an angle formed by the direction (Y-direction) of the channel widths Wn and Wp and the crystal orientations HKa and HKb of the semiconductor layer 11 is more than 30 degrees and less than 60 degrees (45 degrees in the present exemplary embodiment).

The channel width Wp of the p-type MIS transistor PM is greater than the channel width Wn of the n-type MIS transistor NM. The channel width Wn of the n-type MIS transistor NM is greater than the channel length Ln of the n-type MIS transistor NM. The channel width Wp of the p-type MIS transistor PM is greater than the channel length Lp of the p-type MIS transistor PM. The difference between the channel length Ln of the n-type MIS transistor NM and the channel length Lp of the p-type MIS transistor PM is less than the difference between the channel width Wn of the n-type MIS transistor NM and the channel width Wp of the p-type MIS transistor PM (|Ln-Lp|<|Wn-Wp|).

A main component of the semiconductor layer 21 can be silicon. The front surface 215 of the semiconductor layer 21 containing silicon as a main component can include a cobalt silicide region and/or a nickel silicide region. With such silicide regions, the contact resistance of the transistors of the semiconductor layer 21 is reduced. Further, the semiconductor layer 21 containing silicon as a main component can include a region containing germanium and/or indium. With such a region containing germanium and/or indium, transistor characteristics are adjusted.

Third Exemplary Embodiment

Figure 6A:
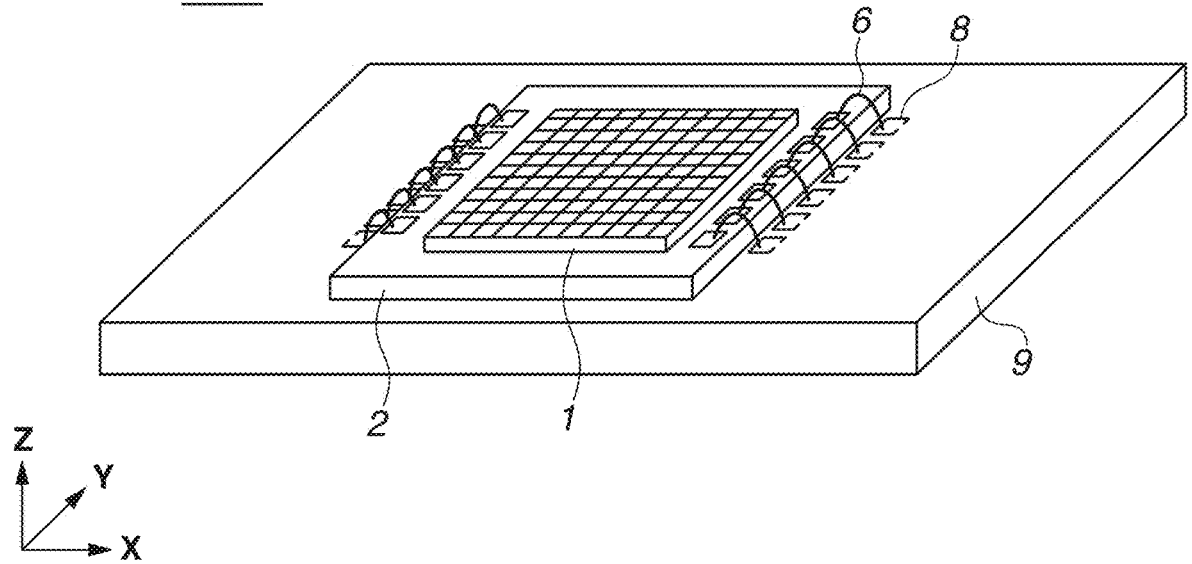
FIGS. 6A and 6B are schematic views illustrating a semiconductor apparatus.
Figure 6B:
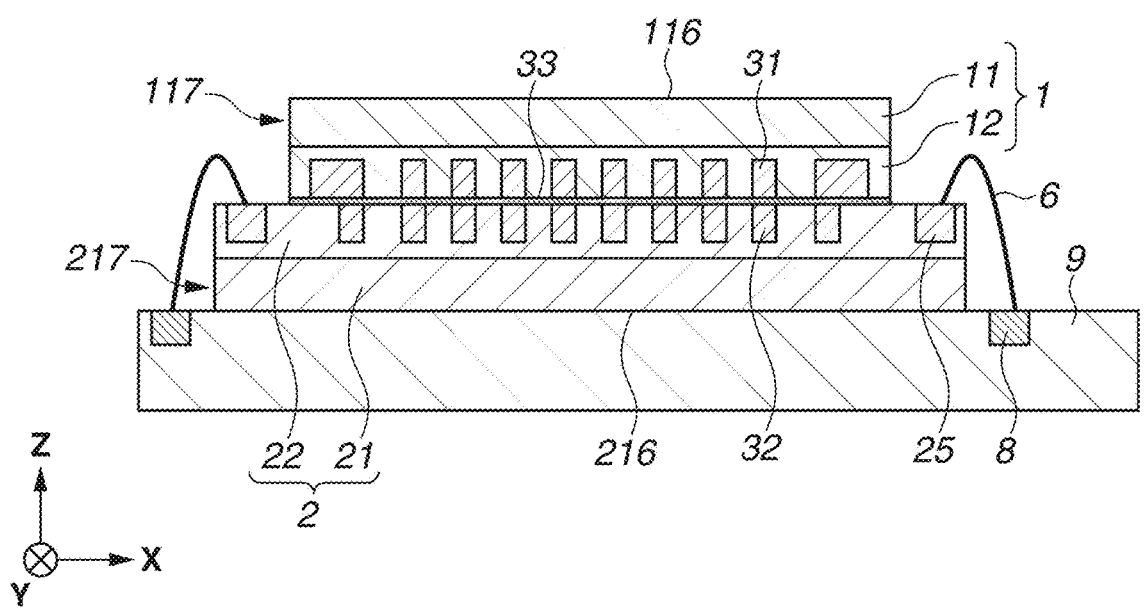

A third exemplary embodiment applicable to the first exemplary embodiment and/or the second exemplary embodiment will be described below. Redundant descriptions of points of the third exemplary embodiment that are similar to those in the first exemplary embodiment and/or the second exemplary embodiment are omitted. FIGS. 6A and 6B are schematic views according to the third exemplary embodiment. The chip 1 overlaps the chip 2 as in FIG. 1A. The chip 2 has a larger contour than the contour of the chip 1. The contour of the chip 1 (semiconductor layer 11) is defined by the side surface 117 that shares a side with the back surface 116 of the semiconductor layer 11. The contour of the chip 2 (semiconductor layer 21) is defined by the side surface 217 that shares a side with the back surface 216 of the semiconductor layer 21. The side surface 117 of the chip 1 overlaps the back surface 216, which is a principal surface of the chip 2. The foregoing structure is realized by the above-described second or third method for fabricating the semiconductor apparatus APR including the chips 1 and 2.

The semiconductor layer 11 of the chip 1 can be a compound semiconductor layer. A compound semiconductor layer can be used as a light-receiving layer or a light-emitting layer. For example, a compound semiconductor layer as the semiconductor layer 11 of the chip 1 can be a light-receiving layer of the semiconductor apparatus APR as an infrared sensor that receives infrared rays. In this case, the chip 2 can be a read-only integrated circuit (ROIC) for reading signals from the semiconductor layer 11. For example, a compound semiconductor layer as the semiconductor layer 11 of the chip 1 can be a light-emitting layer that emits light with a single peak wavelength in the semiconductor apparatus APR such as a laser light source or a light emitting diode (LED). In a case where the semiconductor layer 11 of the chip 1 is a compound semiconductor layer, the semiconductor layer 21 of the chip 2 does not have to be a compound semiconductor layer and can be composed of a group IV semiconductor, such as silicon or germanium, and in the present exemplary embodiment, the semiconductor layer 21 can be a silicon layer.

The semiconductor layer 11 as a compound semiconductor layer can be composed of, for example, a group III-V semiconductor or group II-VI semiconductor and can be a binary mixed crystal, ternary mixed crystal, or quaternary mixed crystal. The above-described relationships between crystal orientations and Young's moduli are applicable to group III-V semiconductors such as gallium arsenide (GaAs). Specifically, a Young's modulus of a group III-V semiconductor in directions along <110> orientations is higher than a Young's modulus of the group III-V semiconductor in directions along <100> orientations. A Young's modulus of the group III-V semiconductor in directions along <111> orientations is higher than a Young's modulus of the group III-V semiconductor in directions along <110> orientations. For example, a Young's modulus of a gallium arsenide layer in directions parallel to <100> orientations is about 85 GPa (80 GPa to 90 GPa). A Young's modulus of the gallium arsenide layer in directions parallel to <110> orientations is about 122 GPa (117 GPa to 127 GPa). A Young's modulus of the gallium arsenide layer in directions parallel to <111> orientations is about 142 GPa (137 GPa to 147 GPa). A Young's modulus in a direction between the <100> and <110> orientations is a value between the Young's modulus in the directions parallel to the <100> orientations and the Young's modulus in the directions parallel to the <110> orientations. A Young's modulus in a direction between the <110> and <111> orientations is a value between the Young's modulus in the directions parallel to the <110> orientations and the Young's modulus in the directions parallel to the <111> orientations.

The semiconductor layer 11 can include a plurality of semiconductor regions. The plurality of semiconductor regions (e.g., InGaAs region and InP region) of the semiconductor layer 11 can form a quantum well structure. For example, the semiconductor layer 11 can have a quantum well structure including an InGaAs region and an InP region. The semiconductor layer 11 can have a quantum well structure including an InGaAs region and a GaAsSb region or a quantum well structure including a GaInNAs region and a GaAsSb region. The semiconductor layer 11 can have a quantum well structure including an InAs region and a GaSb region or a quantum well structure including an InAsSb region and an InGaSb region. By using a laser in dicing a wafer into the chip 1, difficult-to-cut materials such as compound semiconductors are diced into chips without delamination or chipping.

The chips 1 and 2 are joined together by hybrid joining at the joint surface 33. The chips 1 and 2 can be joined together using bumps, but the hybrid joining is extremely strong, and the stress interaction between the chips 1 and 2 often becomes excessive. Thus, in a case where the hybrid joining is employed, it is desirable to set the crystal orientations HKa, HKb, LKa, and LKb of the semiconductor layer 11 as described above. The chips 1 and 2 are arranged on a substrate 9. The chip 2 includes an electrode 25, and the substrate 9 includes an electrode 8. The electrodes 25 and 8 are connected via a bonding wire 6. Integrated circuit parts for controlling the chip 2, integrated circuit parts for processing signals output from the chip 2, passive parts such as capacitors and resistors, and active parts such as transistors and diodes can be arranged on the substrate 9. To prevent cracking of the semiconductor layer 11, the substrate 9 is desirably not a flexible substrate but a rigid substrate. The substrate 9 can be a ceramic substrate or a resin substrate such as an epoxy substrate (glass epoxy substrate) or polyimide substrate.

Fourth Exemplary Embodiment

A fourth exemplary embodiment applicable to the first to third exemplary embodiments will be described below. Redundant descriptions of points of the fourth exemplary embodiment that are similar to those in the first to third exemplary embodiments are omitted. The device EQP illustrated in FIG. 1B will be described in detail below. The semiconductor apparatus APR can include the package PKG storing the semiconductor device IC in addition to the semiconductor device IC in which the chips 1 and 2 are stacked. The package PKG can include a base material, a cover such as glass, and a connection member such as bonding wires and bumps. The semiconductor device IC is fixed to the base material. The covering material faces the semiconductor device IC. The connection member connects terminals on the base material to terminals on the semiconductor device IC.

The device EQP can further include at least one of the optical apparatus OPT, the control apparatus CTRL, the processing apparatus PRCS, the display apparatus DSPL, and the storage apparatus MMRY. The optical apparatus OPT forms an image on the semiconductor apparatus APR serving as a photoelectric conversion apparatus and is, for example, a lens, a shutter, and a mirror. The control apparatus CTRL controls the semiconductor apparatus APR and is, for example, a semiconductor device such as an application-specific integrated circuit (ASIC). The processing apparatus PRCS processes signals output from the semiconductor apparatus APR and forms an analog front end (AFE) or a digital front end (DFE). The processing apparatus PRCS is a semiconductor device such as a central processing unit (CPU) or an ASIC. The display apparatus DSPL is an electroluminescence (EL) display apparatus or liquid crystal display apparatus that displays information (image) acquired by the semiconductor apparatus APR. The storage apparatus MMRY is a semiconductor device such as a magnetic device that stores information (image) acquired by the semiconductor apparatus APR. The storage apparatus MMRY is a volatile memory, such as a static random access memory (SRAM) or dynamic random access memory (DRAM), or a non-volatile memory, such as a flash memory or hard disk drive. The mechanical apparatus MCHN includes a moving unit or a driving unit such as a motor or engine. The device EQP displays signals output from the semiconductor apparatus APR on the display apparatus DSPL and externally transmits the signals via a communication apparatus (not illustrated) of the device EQP. Thus, the device EQP desirably includes the storage apparatus MMRY and the processing apparatus PRCS in addition to a storage circuit unit and a calculation circuit unit of the semiconductor apparatus APR.

The device EQP illustrated in FIG. 1B can be an electronic device with an imaging function, such as an information terminal (e.g., smartphone, wearable terminal) or a camera (e.g., interchangeable lens camera, compact camera, video camera, monitoring camera). The mechanical apparatus MCHN of a camera drives parts of the optical apparatus OPT for zooming, focusing, and shutter operations. Further, the device EQP can be a transportation device (moving object) such as a vehicle, ship, or aircraft. The mechanical apparatus MCHN of a transportation device is used as a moving apparatus. The device EQP as a transportation device is suitable for transporting the semiconductor apparatus APR and supporting and/or automating driving (steering) using an imaging function. The processing apparatus PRCS for supporting and/or automating driving (steering) performs processing to operate the mechanical apparatus MCHN as a moving apparatus based on information acquired by the semiconductor apparatus APR.

The semiconductor apparatus APR according to the present exemplary embodiment provides a great value to its designer, manufacturer, seller, purchaser, and/or user. Thus, if the semiconductor apparatus APR is mounted on the device EQP, the value of the device EQP increases. Therefore, it is advantageous to mount the device EQP on the semiconductor apparatus APR according to the present exemplary embodiment from the point of view of increasing the value of the device EQP in manufacturing and selling the device EQP.

The invention is not limited to the above-described exemplary embodiments, and various modifications are possible. For example, a modification that a part of a configuration of an exemplary embodiment is added to another exemplary embodiment and a modification that a part of a configuration of an exemplary embodiment is replaced by a part of another exemplary embodiment are also exemplary embodiments. The disclosure of the present specification is not limited to those that are described in the present specification and encompasses all points that can be understood from the present specification and the drawings attached to the present specification. Further, the disclosure of the present specification encompasses the complement of each concept described in the present specification. Specifically, for example, if the present specification includes the description "A is greater than B", it is understood that the present specification also discloses that "A is not greater than B" even if the present specification does not include the description "A is not greater than B", because the disclosure of the description "A is greater than B" is based on the assumption that a case where "A is not greater than B" is taken into consideration.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-221442, filed Dec. 6, 2019, which is hereby incorporated by reference herein in its entirety.

What is claimed is:

1. A semiconductor apparatus comprising:
a first semiconductor layer;
a second semiconductor layer overlapping the first semiconductor layer; and
a wiring structure arranged between the first semiconductor layer and the second semiconductor layer,
wherein the second semiconductor layer is provided with a p-type metal insulator semiconductor (p-type MIS) transistor, wherein a crystal structure of the first semiconductor layer has a first crystal orientation and a second crystal orientation in a direction along a principal surface of the first semiconductor layer, and a Young's modulus of the first semiconductor layer in a direction along the first crystal orientation is higher than a Young's modulus of the first semiconductor layer in a direction along the second crystal orientation,
wherein an angle formed by the first crystal orientation and a direction in which a source and a drain of the p-type MIS transistor are arranged is more than 30 degrees and less than 60 degrees, and
wherein an angle formed by the second crystal orientation and the direction in which the source and the drain of the p-type MIS transistor are arranged is 0 degrees or more and 30 degrees or less.

2. The semiconductor apparatus according to claim 1,
wherein a crystal structure of the second semiconductor layer has a third crystal orientation and a fourth crystal orientation in a direction along a principal surface of the second semiconductor layer, and a Young's modulus of the second semiconductor layer in a direction along the third crystal orientation is higher than a Young's modulus of the second semiconductor layer in a direction along the fourth crystal orientation, and
wherein an angle formed by the first crystal orientation and the third crystal orientation is 0 degrees or more and 30 degrees or less.

3. The semiconductor apparatus according to claim 1, wherein the crystal structure of the first semiconductor layer has a first cleavage orientation and a second cleavage orientation intersecting with the first cleavage orientation, and an angle formed by the first cleavage orientation and the second cleavage orientation is 60 degrees or more and 90 degrees or less.

4. The semiconductor apparatus according to claim 1,
wherein a main component of the second semiconductor layer is silicon, and
wherein a front surface of the second semiconductor layer includes a cobalt silicide region and/or a nickel silicide region.

5. The semiconductor apparatus according to claim 1,
wherein a main component of the second semiconductor layer is silicon, and
wherein the second semiconductor layer includes a region containing germanium and/or indium.

6. The semiconductor apparatus according to claim 1,
wherein the second semiconductor layer includes an n-type MIS transistor, and
wherein a channel width of the p-type MIS transistor is greater than a channel width of the n-type MIS transistor.

7. The semiconductor apparatus according to claim 1,
wherein the second semiconductor layer is provided with a first p-type MIS transistor and a second p-type MIS transistor,
wherein an angle formed by a direction in which a source and a drain of the first p-type MIS transistor are arranged and a direction in which a source and a drain of the second p-type MIS transistor are arranged is 60 degrees or more and 90 degrees or less,
wherein an angle formed by the first crystal orientation of the first semiconductor layer and the direction in which the source and the drain of the first p-type MIS transistor are arranged is more than 30 degrees and less than 60 degrees, and
wherein an angle formed by the first crystal orientation of the first semiconductor layer and the direction in which the source and the drain of the second p-type MIS transistor are arranged is more than 30 degrees and less than 60 degrees.

8. The semiconductor apparatus according to claim 1,
wherein the wiring structure includes a first wiring structure between the first semiconductor layer and the second semiconductor layer and a second wiring structure between the first wiring structure and the second semiconductor layer,
wherein the first wiring structure includes an insulator member and a metal pad in a depression of the insulator member of the first wiring structure,
wherein the second wiring structure includes an insulator member and a metal pad in a depression of the insulator member of the second wiring structure, and
wherein the insulator member of the first wiring structure and the insulator member of the second wiring structure are covalently bonded, and the metal pad of the first wiring structure and the metal pad of the second wiring structure are metal-bonded.

9. The semiconductor apparatus according to claim 8,
wherein the crystal structure of the first semiconductor layer has a first cleavage orientation and a second cleavage orientation intersecting with the first cleavage orientation,
wherein the wiring structure includes:
a first joint portion where a first metal pad of the first wiring structure and a first metal pad of the second wiring structure are joined together;
a second joint portion where a second metal pad of the first wiring structure and a second metal pad of the second wiring structure are joined together;
a third joint portion where a third metal pad of the first wiring structure and a third metal pad of the second wiring structure are joined together; and
a fourth joint portion where the third metal pad of the first wiring structure and the third metal pad of the second wiring structure are joined together,
wherein the first joint portion and the second joint portion are arranged along the first cleavage orientation,
wherein the third joint portion and the fourth joint portion are arranged along the second cleavage orientation, and
wherein a line connecting the third joint portion and the fourth joint portion passes between the first joint portion and the second joint portion.

10. The semiconductor apparatus according to claim 1,
wherein the first semiconductor layer includes an n-type MIS transistor, and
wherein the first semiconductor layer does not include a p-type MIS transistor.

11. The semiconductor apparatus according to claim 1,
wherein the first semiconductor layer includes a first transistor that is an n-type MIS transistor, and
wherein an angle formed by a direction in which a source and a drain of the first transistor are arranged and the first crystal orientation of the first semiconductor layer is more than 30 degrees and less than 60 degrees.

12. The semiconductor apparatus according to claim 11,
wherein the first semiconductor layer includes a second transistor that is an n-type MIS transistor,
wherein an angle formed by a direction in which a source and a drain of the second transistor are arranged and the first crystal orientation of the first semiconductor layer is more than 30 degrees and less than 60 degrees, and wherein an angle formed by the direction in which the source and the drain of the first transistor are arranged and the direction in which the source and the drain of the second transistor are arranged is 60 degrees or more and 90 degrees or less.

13. The semiconductor apparatus according to claim 12, wherein the first semiconductor layer includes a third transistor that is an n-type MIS transistor, and
wherein an angle formed by a direction in which a source and a drain of the third transistor are arranged and the first crystal orientation of the first semiconductor layer is 60 degrees or more and 90 degrees or less.

14. The semiconductor apparatus according to claim 1, wherein an element region of the first semiconductor layer is defined by an element separation portion including an insulator having a pattern of a periodically-repeated unit pattern, and an angle formed by 75% or more of a contour of the element separation portion in the unit pattern with respect to the first crystal orientation of the first semiconductor layer is more than 30 degrees and less than 60 degrees.

15. The semiconductor apparatus according to claim 1, wherein an angle formed by the first crystal orientation of the first semiconductor layer and four sides of the first semiconductor layer is more than 30 degrees and less than 60 degrees.

16. The semiconductor apparatus according to claim 1, wherein a length of at least one side of the first semiconductor layer is 10 mm or more.

17. The semiconductor apparatus according to claim 1, wherein the second semiconductor layer has a thickness of 700 μm or more and 800 μm or less.

18. The semiconductor apparatus according to claim 1, wherein the first semiconductor layer is a compound semiconductor layer.

19. The semiconductor apparatus according to claim 1, wherein the first semiconductor layer includes an InGaAs region and an InP region.

20. The semiconductor apparatus according to claim 1, wherein the first crystal orientation is a <110> orientation, and the second crystal orientation is a <100> orientation.

21. A device comprising:
the semiconductor apparatus according to claim 1; and
at least one of:
an optical apparatus corresponding to the semiconductor apparatus;
a control apparatus that controls the semiconductor apparatus;
a processing apparatus that processes a signal output from the semiconductor apparatus;
a display apparatus that displays information acquired from the semiconductor apparatus;
a storage apparatus that stores the information acquired from the semiconductor apparatus; and
a mechanical apparatus that operates based on the information acquired from the semiconductor apparatus.

* * * * *